(12) United States Patent
Kwok et al.

(10) Patent No.: US 9,388,740 B2
(45) Date of Patent: Jul. 12, 2016

(54) THERMOELECTRIC GENERATOR IN TURBINE ENGINE NOZZLES

(75) Inventors: David W. Kwok, La Mirada, CA (US); James P. Huang, Irvine, CA (US); Jack W. Mauldin, Mill Creek, WA (US)

(73) Assignee: The Boeing Company, Chicago, IL (US)

( * ) Notice: Subject to any disclaimer, the term of this patent is extended or adjusted under 35 U.S.C. 154(b) by 1185 days.

(21) Appl. No.: 13/397,436

(22) Filed: Feb. 15, 2012

(65) Prior Publication Data

US 2013/0205798 A1    Aug. 15, 2013

(51) Int. Cl.
| | |
|---|---|
| F02C 6/18 | (2006.01) |
| F02K 1/82 | (2006.01) |
| F02C 6/04 | (2006.01) |
| H01L 35/30 | (2006.01) |
| F01D 15/10 | (2006.01) |
| F02K 1/00 | (2006.01) |
| F02K 3/06 | (2006.01) |
| F02C 7/32 | (2006.01) |

(52) U.S. Cl.
CPC . *F02C 6/18* (2013.01); *F01D 15/10* (2013.01); *F02C 6/04* (2013.01); *F02K 1/00* (2013.01); *F02K 1/82* (2013.01); *F02K 3/06* (2013.01); *H01L 35/30* (2013.01); *F02C 7/32* (2013.01); *F05D 2220/76* (2013.01); *Y02T 50/53* (2013.01)

(58) Field of Classification Search
CPC ............. F02C 6/04; F02C 6/18; F02C 7/32; F05D 2220/76; F02K 1/78; F02K 3/02; F02K 1/00; F02K 3/06; H01L 35/28; H01L 35/30

See application file for complete search history.

(56) References Cited

U.S. PATENT DOCUMENTS

| | | | | |
|---|---|---|---|---|
| 3,290,177 | A  * | 12/1966 | Mole et al. ..................... | 136/204 |
| 3,782,927 | A  * | 1/1974 | Nicolaou ....................... | 420/589 |
| 4,477,686 | A  * | 10/1984 | Nakajima et al. ............. | 136/203 |
| 5,269,135 | A  * | 12/1993 | Vermejan .................. | F02C 7/04 |
| | | | | 60/226.1 |
| 5,584,183 | A  * | 12/1996 | Wright et al. ..................... | 62/3.7 |
| 5,738,493 | A  * | 4/1998 | Lee et al. .................... | 416/97 R |
| 6,443,003 | B1 * | 9/2002 | Bailis .......................... | 73/204.12 |
| 6,787,691 | B2 * | 9/2004 | Fleurial et al. ................. | 136/203 |
| 7,100,369 | B2 * | 9/2006 | Yamaguchi et al. ............ | 60/324 |
| 7,360,365 | B2 * | 4/2008 | Codecasa et al. ................ | 62/3.3 |
| 2003/0111990 | A1* | 6/2003 | Miyauchi et al. ............. | 323/288 |
| 2004/0045594 | A1* | 3/2004 | Hightower ................ | F02C 6/18 |
| | | | | 136/205 |
| 2004/0076214 | A1* | 4/2004 | Bell ................................ | 374/13 |
| 2005/0022855 | A1* | 2/2005 | Raver ........................ | F02C 6/18 |
| | | | | 136/205 |
| 2005/0172993 | A1* | 8/2005 | Shimoji et al. ................. | 136/208 |
| 2005/0268955 | A1* | 12/2005 | Meyerkord et al. ........... | 136/205 |
| 2006/0032525 | A1* | 2/2006 | Olsen et al. ..................... | 136/203 |
| 2006/0037337 | A1* | 2/2006 | Lear et al. ..................... | 62/238.3 |
| 2008/0173342 | A1* | 7/2008 | Bell et al. ....................... | 136/201 |

(Continued)

FOREIGN PATENT DOCUMENTS

FR            1504078  A   *  12/1967  .............. F01D 15/10

*Primary Examiner* — Putthiwat Wongwian
*Assistant Examiner* — Alain Chau
(74) *Attorney, Agent, or Firm* — Toler Law Group, PC

(57) ABSTRACT

In one embodiment, a gas turbine engine assembly comprises an engine assembly disposed about a longitudinal axis, a core nozzle positioned adjacent the engine assembly to direct a core flow generated by the engine assembly, a fan nozzle surrounding at least a portion of the core nozzle to direct a fan flow, wherein the core nozzle defines a plenum to receive a portion of the core stream flow from the core nozzle and a thermoelectric generator assembly positioned in the plenum. Other embodiments may be described.

19 Claims, 12 Drawing Sheets

(56) References Cited

U.S. PATENT DOCUMENTS

| | | | |
|---|---|---|---|
| 2008/0236643 A1* | 10/2008 | Li | 136/203 |
| 2008/0257395 A1* | 10/2008 | Jovanovic et al. | 136/239 |
| 2009/0092480 A1* | 4/2009 | Kupratis | 415/144 |
| 2009/0120482 A1* | 5/2009 | McCullough et al. | 136/205 |
| 2009/0159110 A1* | 6/2009 | Kwok et al. | 136/205 |
| 2009/0266393 A1* | 10/2009 | Jahns | F01D 15/00 136/201 |
| 2009/0290614 A1* | 11/2009 | Gregory et al. | 374/29 |
| 2009/0322221 A1* | 12/2009 | Makansi | 313/523 |
| 2010/0018316 A1* | 1/2010 | Nicklous et al. | 73/655 |
| 2010/0059096 A1* | 3/2010 | Fukada | 136/205 |
| 2010/0183993 A1* | 7/2010 | McAlister | 431/254 |
| 2011/0048374 A1* | 3/2011 | McAlister | 123/436 |
| 2011/0108080 A1* | 5/2011 | Kwok et al. | 136/205 |
| 2011/0131999 A1* | 6/2011 | Gao et al. | 60/782 |
| 2011/0209740 A1* | 9/2011 | Bell et al. | 136/224 |
| 2011/0283712 A1* | 11/2011 | Brillet | B64D 41/00 60/801 |
| 2012/0031067 A1* | 2/2012 | Sundaram | F01D 25/30 60/39.01 |

* cited by examiner

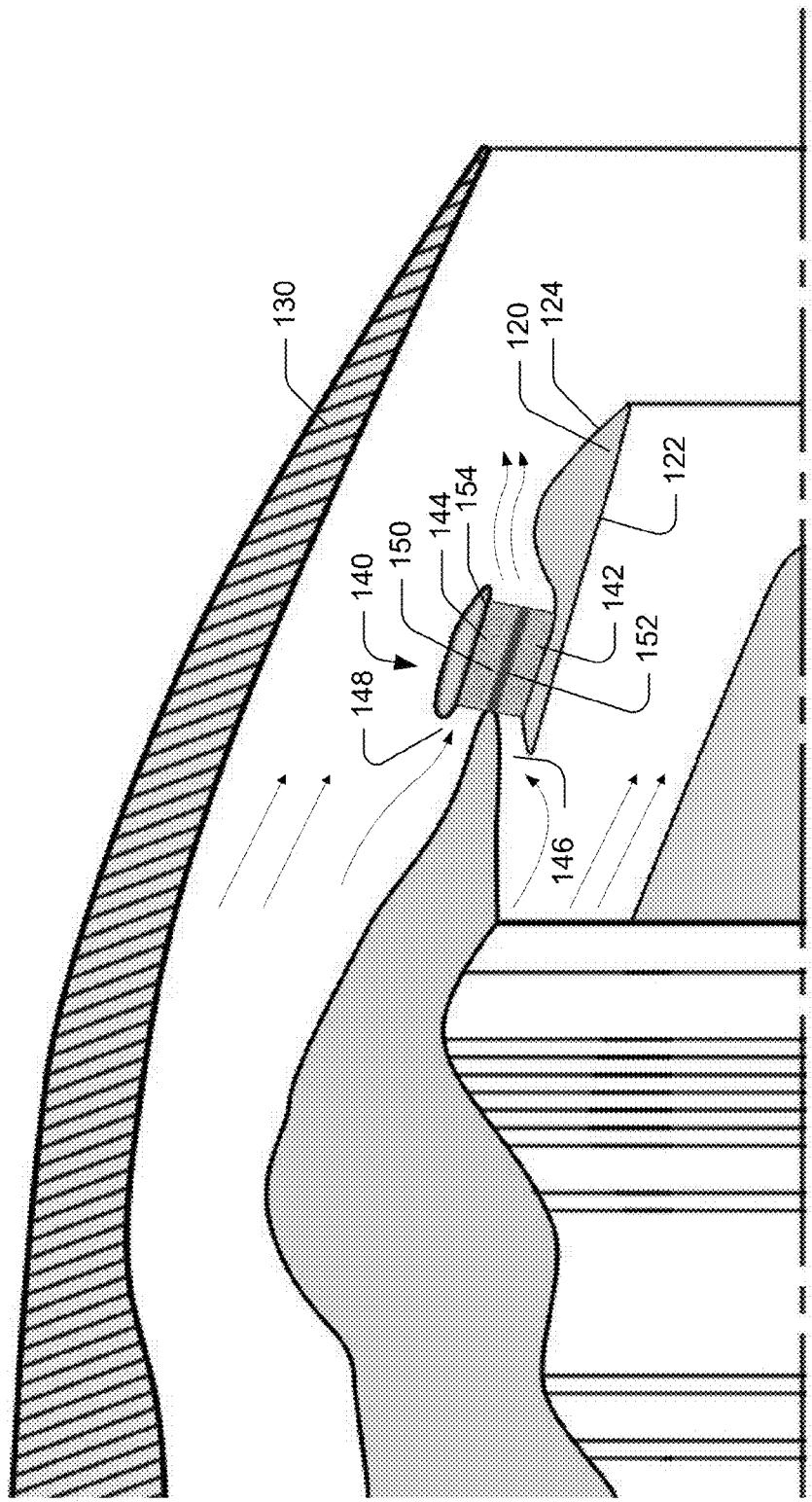

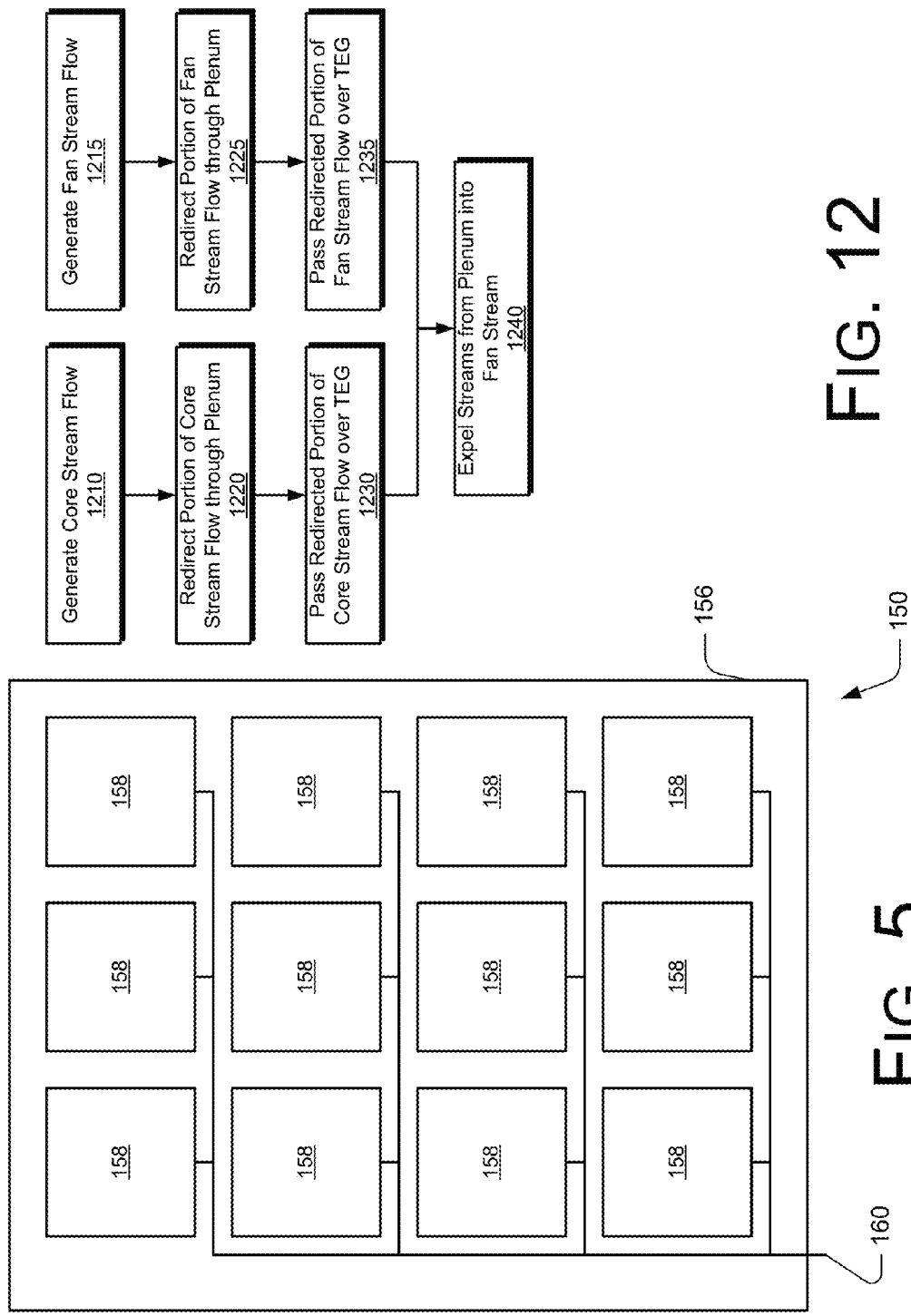

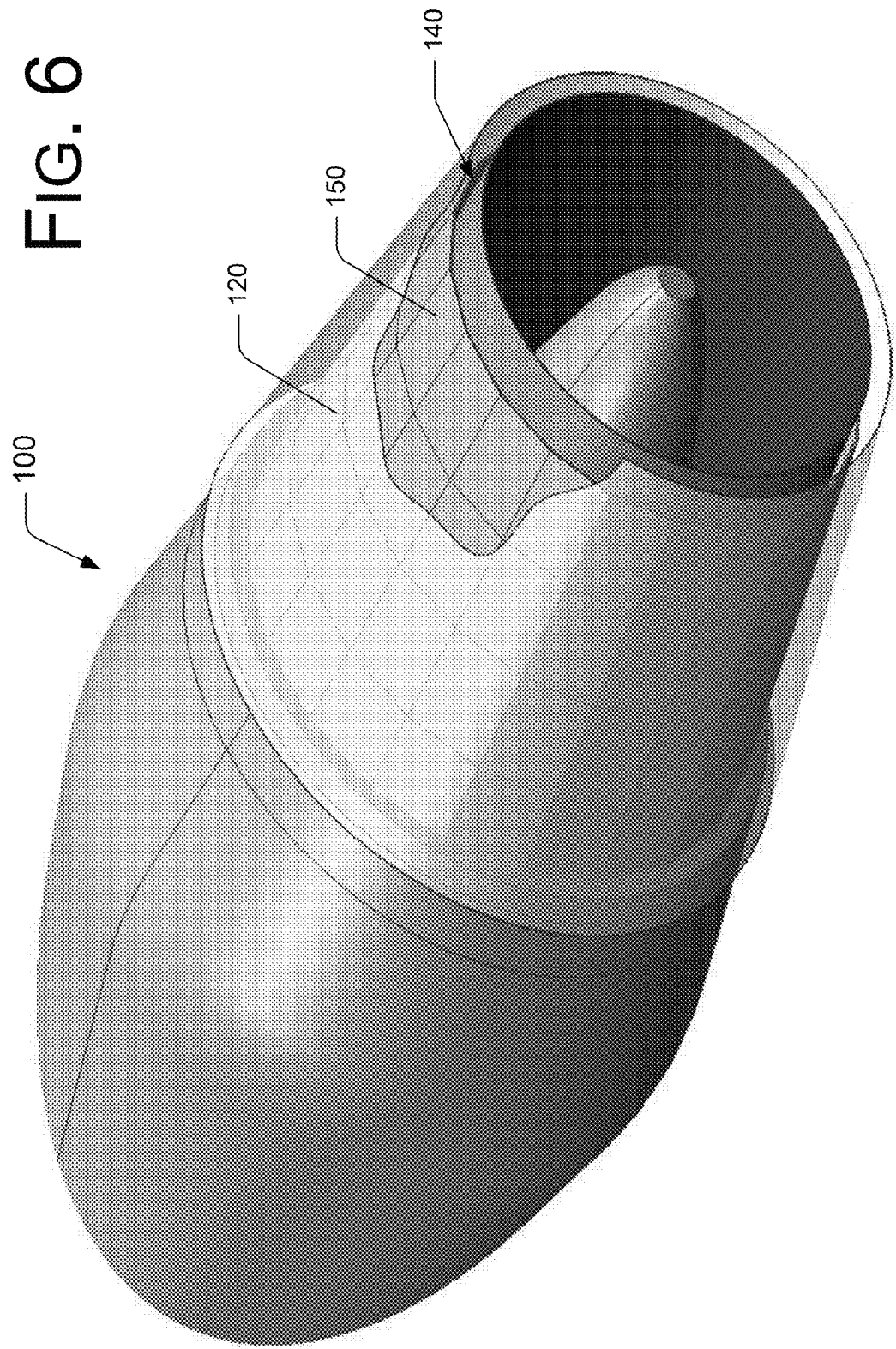

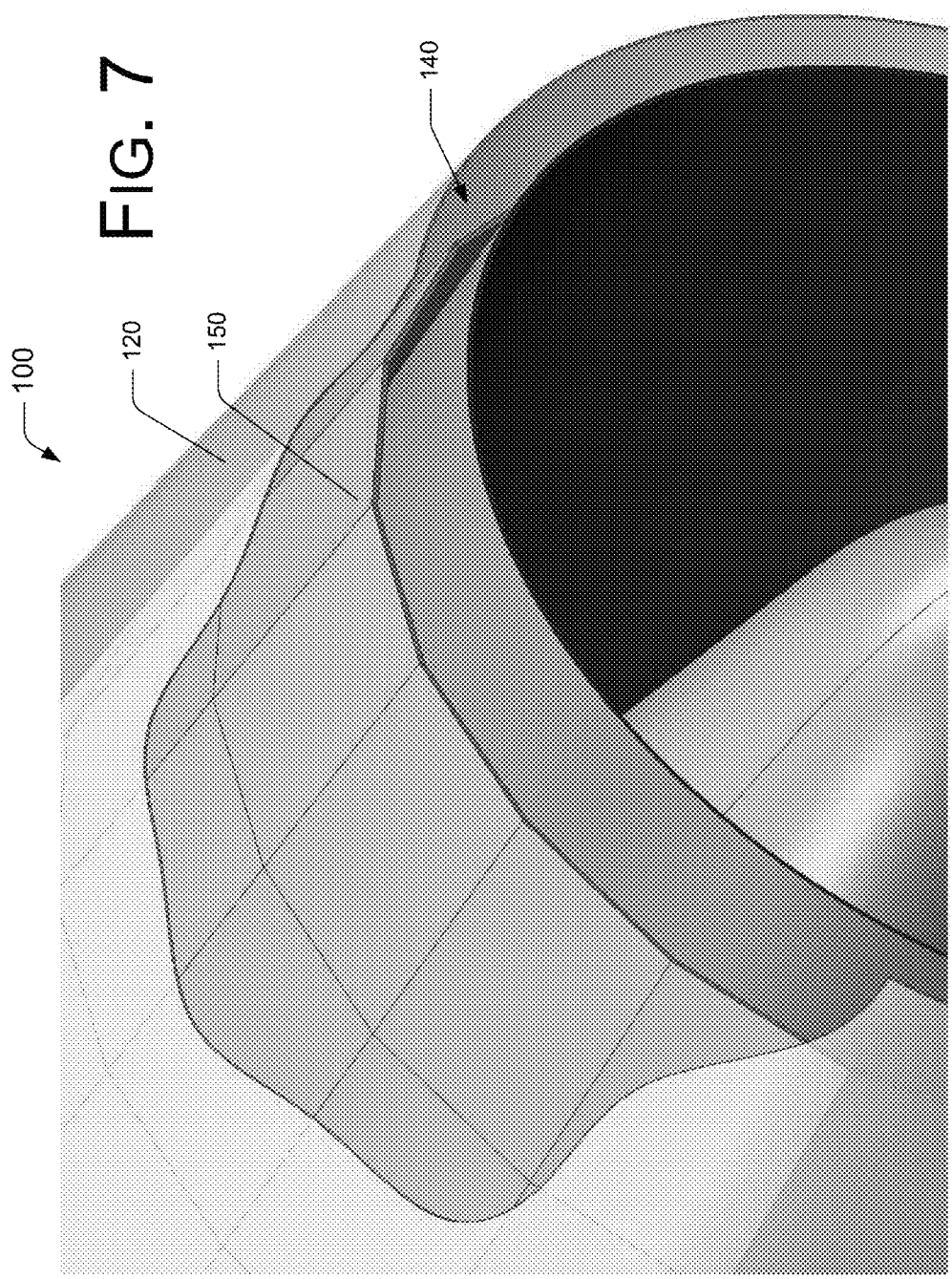

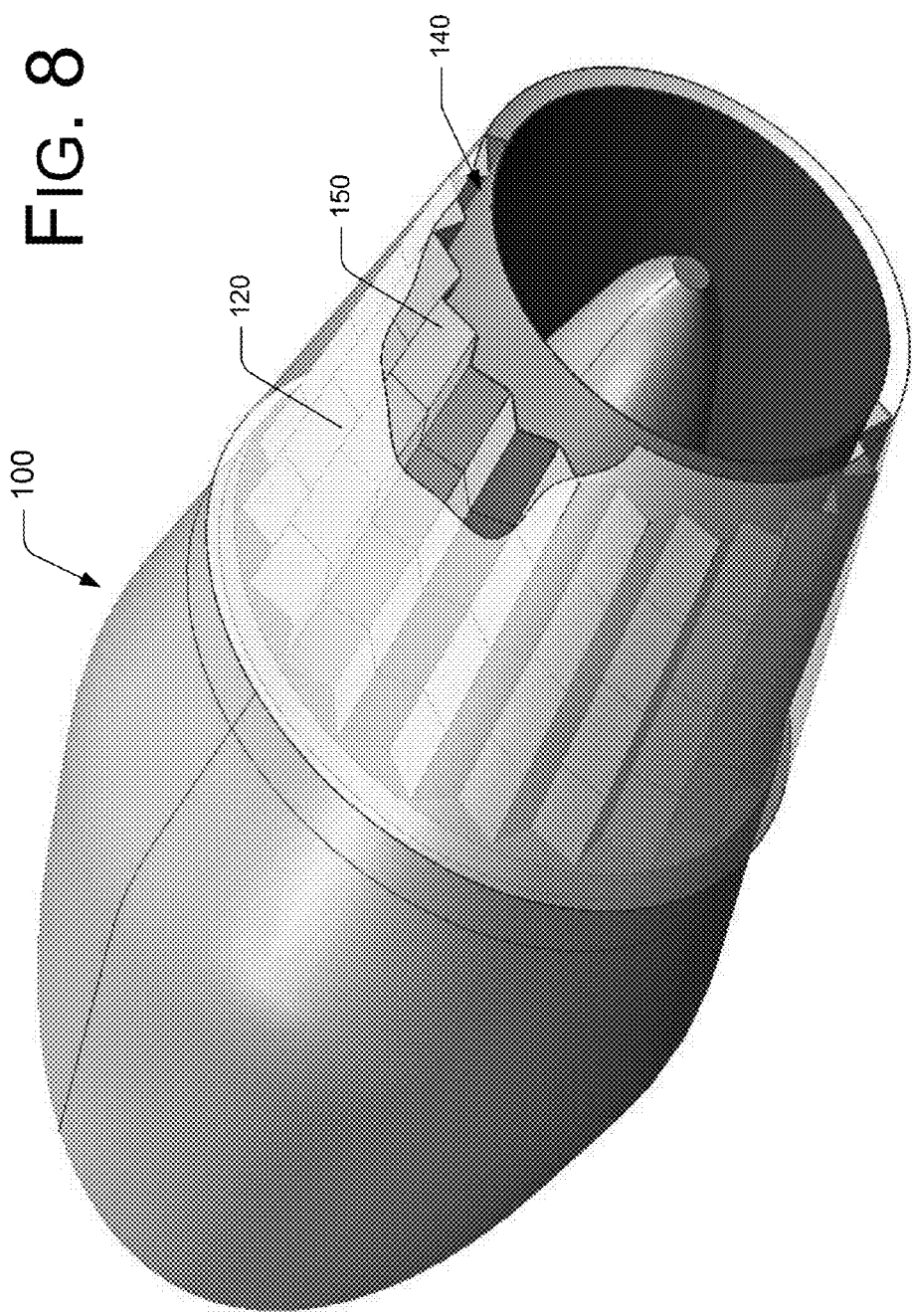

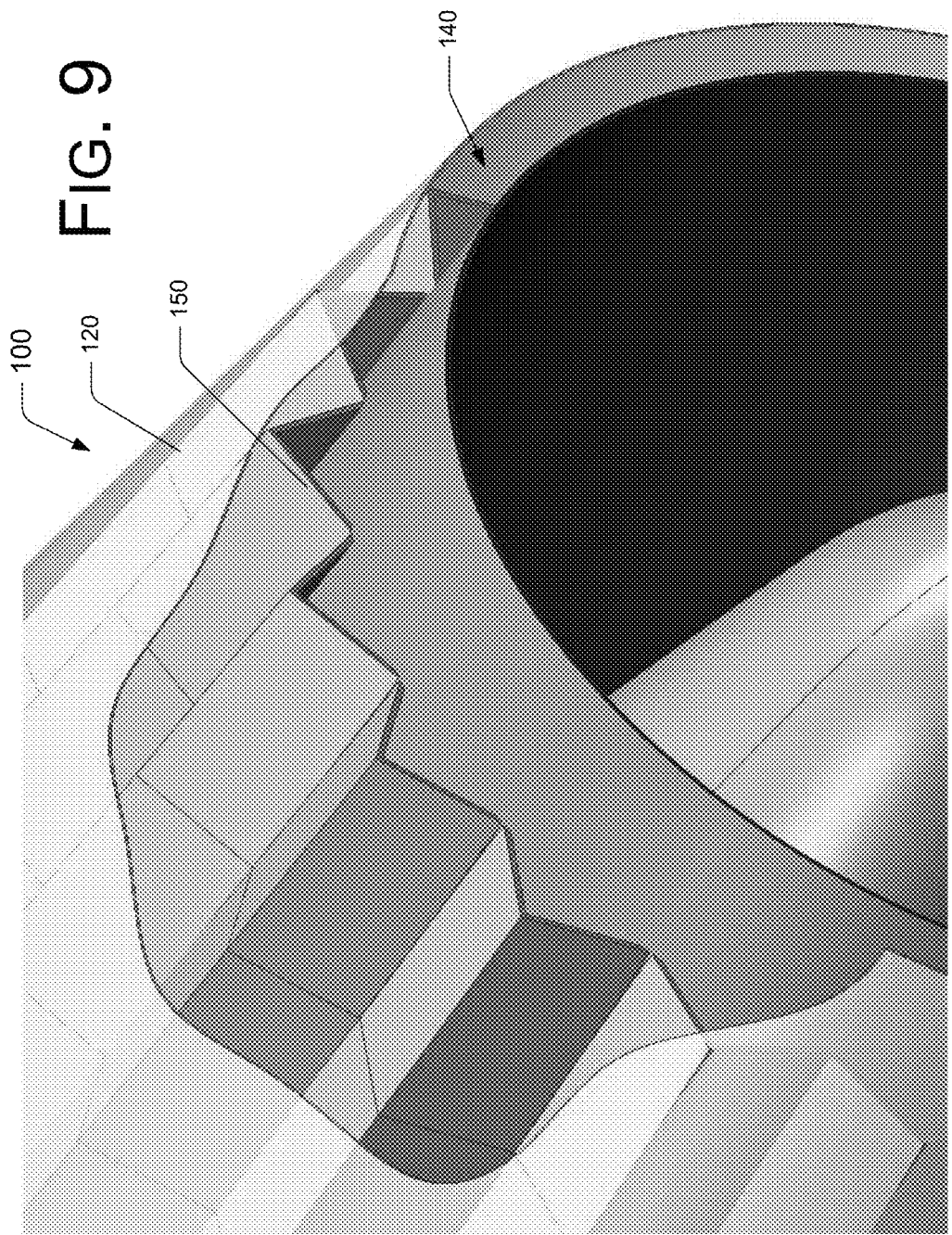

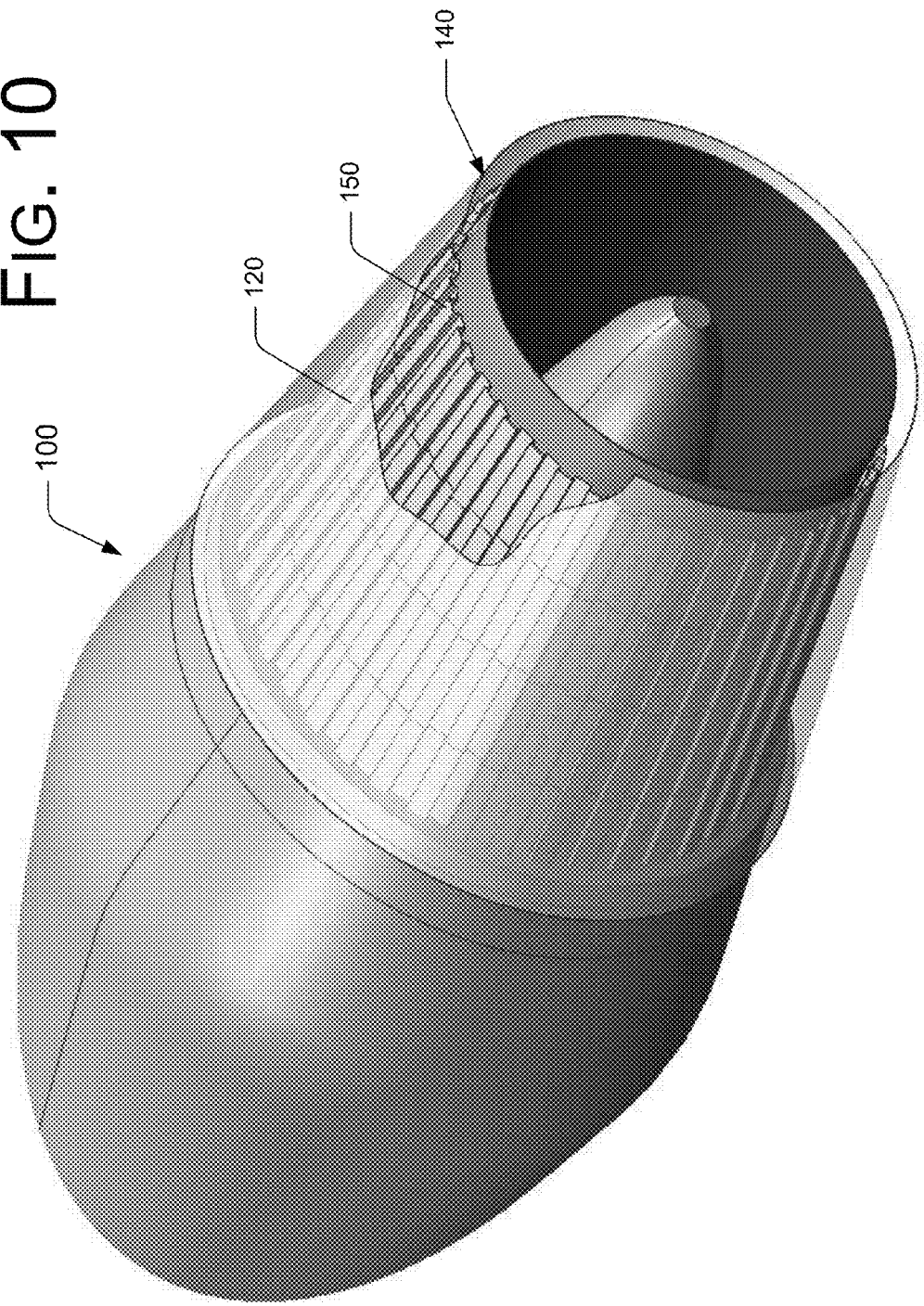

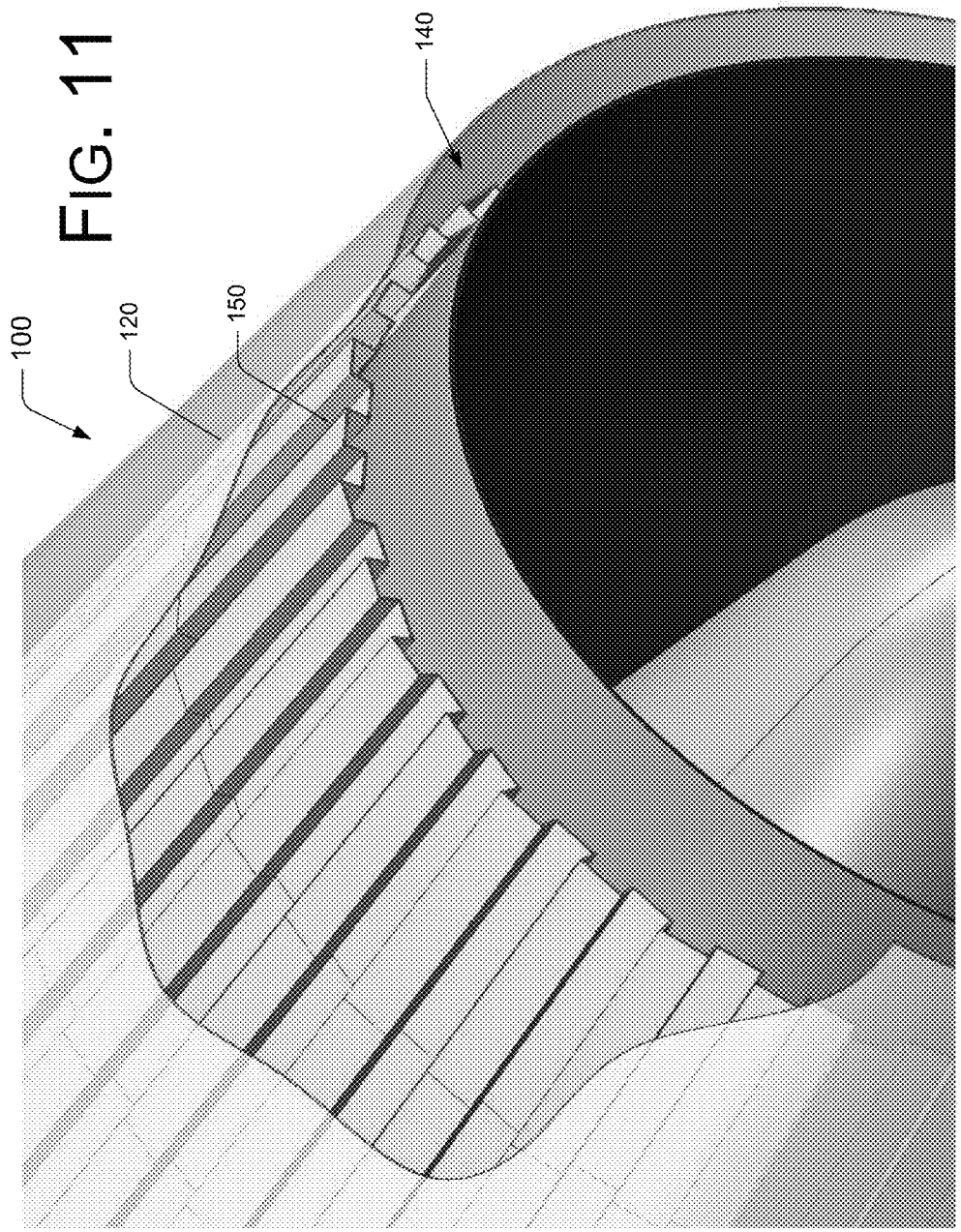

THERMOELECTRIC GENERATOR IN TURBINE ENGINE NOZZLES

RELATED APPLICATIONS

None

FIELD OF THE DISCLOSURE

The subject matter described herein relates to gas turbine engines, and more particularly to nozzle configurations for gas turbine engines.

BACKGROUND

A thermoelectric generator (TEG) is a device that can generate electricity when a temperature differential is applied across the device. A TEG device is typically square or rectangular with the upper and lower end-caps having the same dimension and typically power generated by TEGs is transmitted via a set of power wires. TEG devices are typically thin (e.g., in the order of a couple of millimeters thick), small (e.g., a couple of square centimeters), flat, and brittle. Accordingly, TEG devices can be difficult to handle individually, especially for applications in vehicles, such as automobiles, aircraft and the like. Additionally, these devices can be subject to harsh environmental conditions, such as vibration, constant temperature variations and other harsh conditions. Because of their size and the fact that each TEG device generates only a small amount of power, many TEG devices are bundled together in order to generate a useful amount of power. Further, TEG devices generally provide greater energy conversion efficiency at high temperature differentials. This can cause relatively large thermal expansion in materials. Because of thermal gradients and different thermal coefficients of expansion associated with different materials, thermally induced stresses may result.

Efficiency of TEG devices generally increases with greater temperature differentials, i.e., the delta temperature between two opposite sides, typically called the heat source (hot side) and heat sink (cold side) of the TEG device. Also, energy conversion efficiency is maximized for any installation that channels heat flow through the TEG devices only without any thermal energy leaks through the surrounding structural material or gaps.

Accordingly, techniques to utilize TEG devices may find utility.

SUMMARY

In various aspects, gas turbine engine configurations are provided. By way of example, gas turbine engines may be adapted to incorporate one or more thermoelectric generator assemblies to generate electricity from heat differentials in the gas turbine engine. In some embodiments a portion of the gas stream from the core may be diverted into a plenum where it flows across a first surface of a thermoelectric generator assembly. In further embodiments a portion of the air stream from the fan may be diverted into the plenum where it flows across a second surface of the thermoelectric generator assembly. The thermoelectric generator assembly generates electricity in response to a temperature differential between the gas stream from the core and the air stream from the fan.

Thus, in one aspect there is provided a core nozzle for a gas turbine engine comprising a core nozzle wall defining a core through which a core stream flows, a cowling assembly coupled to the core nozzle wall, wherein the core nozzle wall and the cowling assembly define a plenum to receive a portion of the core stream flow from the core nozzle, and a thermoelectric generator assembly positioned in the plenum.

In another aspect there is provided a gas turbine engine assembly. In one embodiment, the assembly comprises an engine assembly, a core nozzle positioned adjacent the engine assembly to direct a core flow generated by the engine assembly, a fan nozzle surrounding at least a portion of the core nozzle to direct a fan flow wherein the core nozzle defines a plenum to receive a portion of the core stream flow from the core nozzle, and a thermoelectric generator assembly positioned in the plenum.

In another aspect, there is provided a method to generate electricity in a gas turbine engine, comprising generating a core stream flow in the gas turbine engine, redirecting a portion of the core stream flow from a core nozzle positioned downstream of the gas turbine engine into a plenum defined by the core nozzle, and passing the portion of the core stream flow redirected into the plenum over a first surface of a thermoelectric generator assembly.

The features, functions and advantages discussed herein can be achieved independently in various embodiments described herein or may be combined in yet other embodiments, further details of which can be seen with reference to the following description and drawings.

BRIEF DESCRIPTION OF THE DRAWINGS

The detailed description is described with reference to the accompanying figures.

FIG. 4 is a schematic cross-sectional view of a gas turbine engine into which a thermoelectric generator has been installed, according to embodiments.

FIG. 5 is a schematic top view of a thermoelectric generator assembly, according to embodiments.

FIGS. 6-11 are schematic, perspective views of thermoelectric generator assemblies installed on gas turbine engines, according to embodiments.

FIG. 12 is a flowchart illustrating operations in a method to generate electricity in a gas turbine engine, according to embodiments.

DETAILED DESCRIPTION

Figure 1:
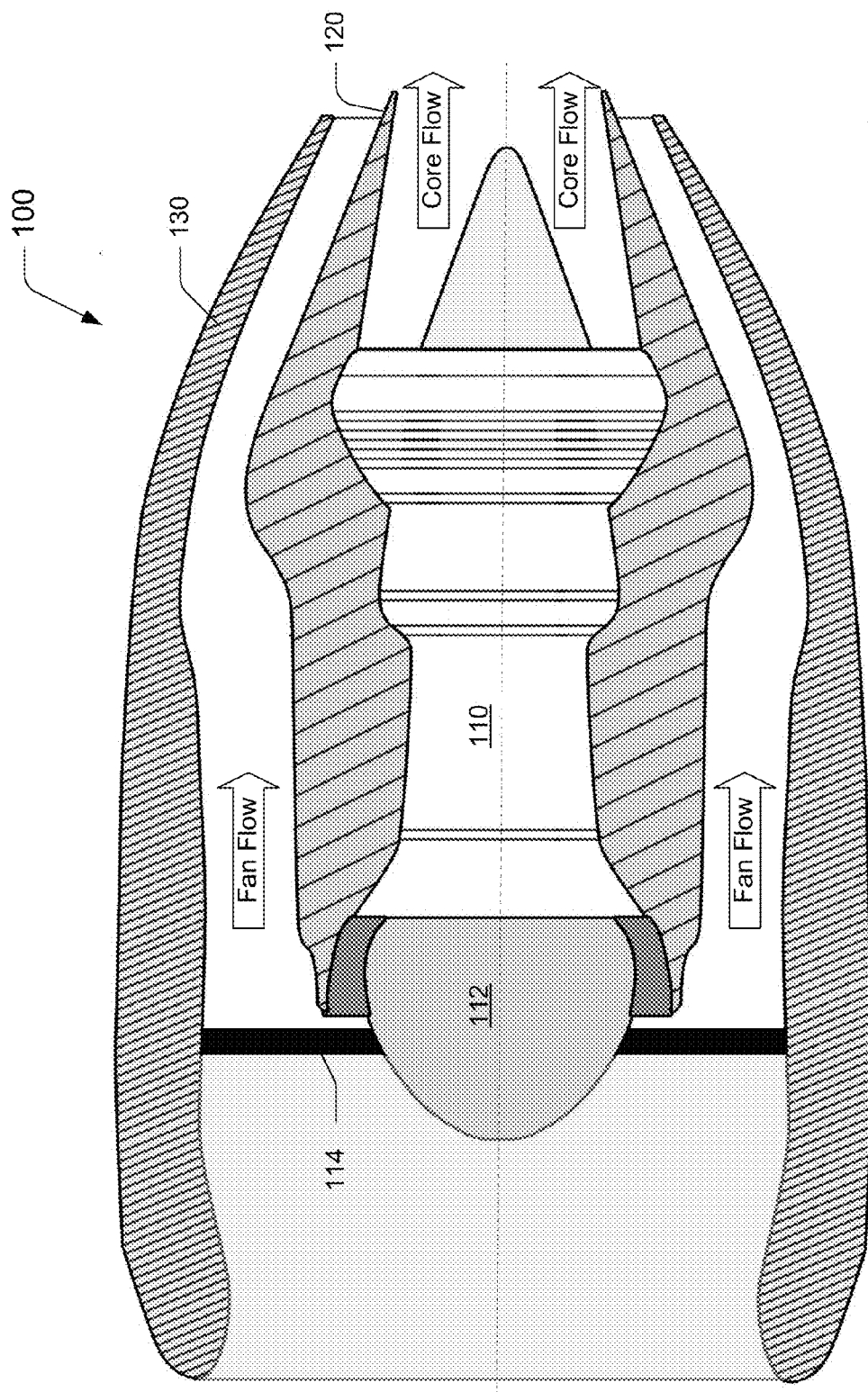
FIGS. 1-3 are schematic cross-sectional illustrations of gas turbine engine configurations into which thermoelectric generators may be installed, according to embodiments.

Described herein are exemplary gas turbine engine nozzle configurations and methods to operate gas turbine engines, and aircraft incorporating such nozzles. In some embodiments, a gas turbine engine core nozzle comprises a housing which defines a plenum. One or more thermoelectric generator devices may be disposed in the plenum. A portion of the gas flow from the engine core is diverted into the plenum, where it flows across a first surface of the thermoelectric generator to create a temperature differential across the thermoelectric generator. In some embodiments, a portion of the fan stream may be directed into the plenum, where it flows across a second surface of the thermoelectric generator. Electricity generated by the thermoelectric generator may be transported via a power bus.

In the following description, numerous specific details are set forth to provide a thorough understanding of various embodiments. However, it will be understood by those skilled in the art that the various embodiments may be practiced without the specific details. In other instances, well-known methods, procedures, components, and circuits have not been illustrated or described in detail so as not to obscure the particular embodiments.

In some embodiments thermoelectric generators may be implemented in gas turbine aircraft engines. Most common modern aircraft jet engines are either turbojet engines or turbofan engines. In a turbojet engine, air is drawn into the engine through an inlet by a compressor, compressed, mixed with fuel, and burned to produce a high temperature and pressure gas stream. Part of the energy in the high pressure gas is extracted by a turbine to run a compressor and to provide power for aircraft systems. After the turbine stage, high pressure gas is accelerated by a nozzle and exhausted to the atmosphere to produce thrust. This part of the engine is commonly referred to as the core or gas generator of the engine. The physical passage for the core gas flow is commonly referred to as the core duct and the external hardware to the core duct is known as the core cowling. The nozzle for the hot core exhaust stream is known as the core nozzle.

In a turbofan engine, a portion of the air flow down stream of the inlet is bypassed around the core and compressed by rotating blades. This air stream is not mixed with fuel and burned therefore is only slightly warmer than the atmosphere due to the energy addition from the blades. The high pressure air is then accelerated through a fan nozzle to produce thrust. This part of the engine is commonly referred to as the fan. The physical passage for the fan flow is commonly referred to as the fan duct and the external hardware to the fan duct is commonly referred to as the fan cowling. The nozzle for the cold fan exhaust stream is commonly referred to as the fan nozzle.

Thrust produced by each stream is determined by the engine design and by the ratio of air mass flow in the bypass or fan stream to the core stream, sometimes referred to as the bypass ratio of the engine.

Figure 2:
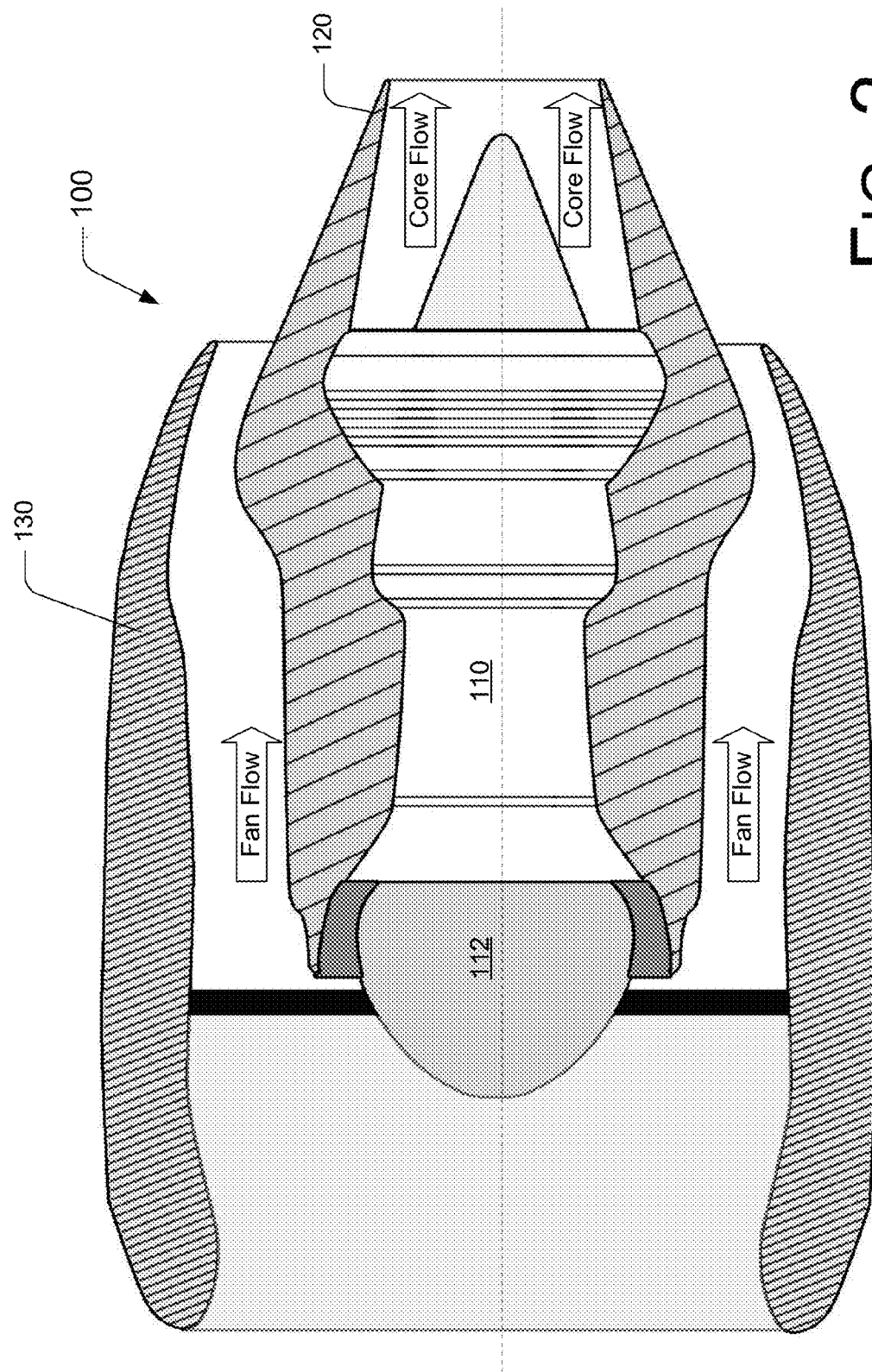
Figure 3:
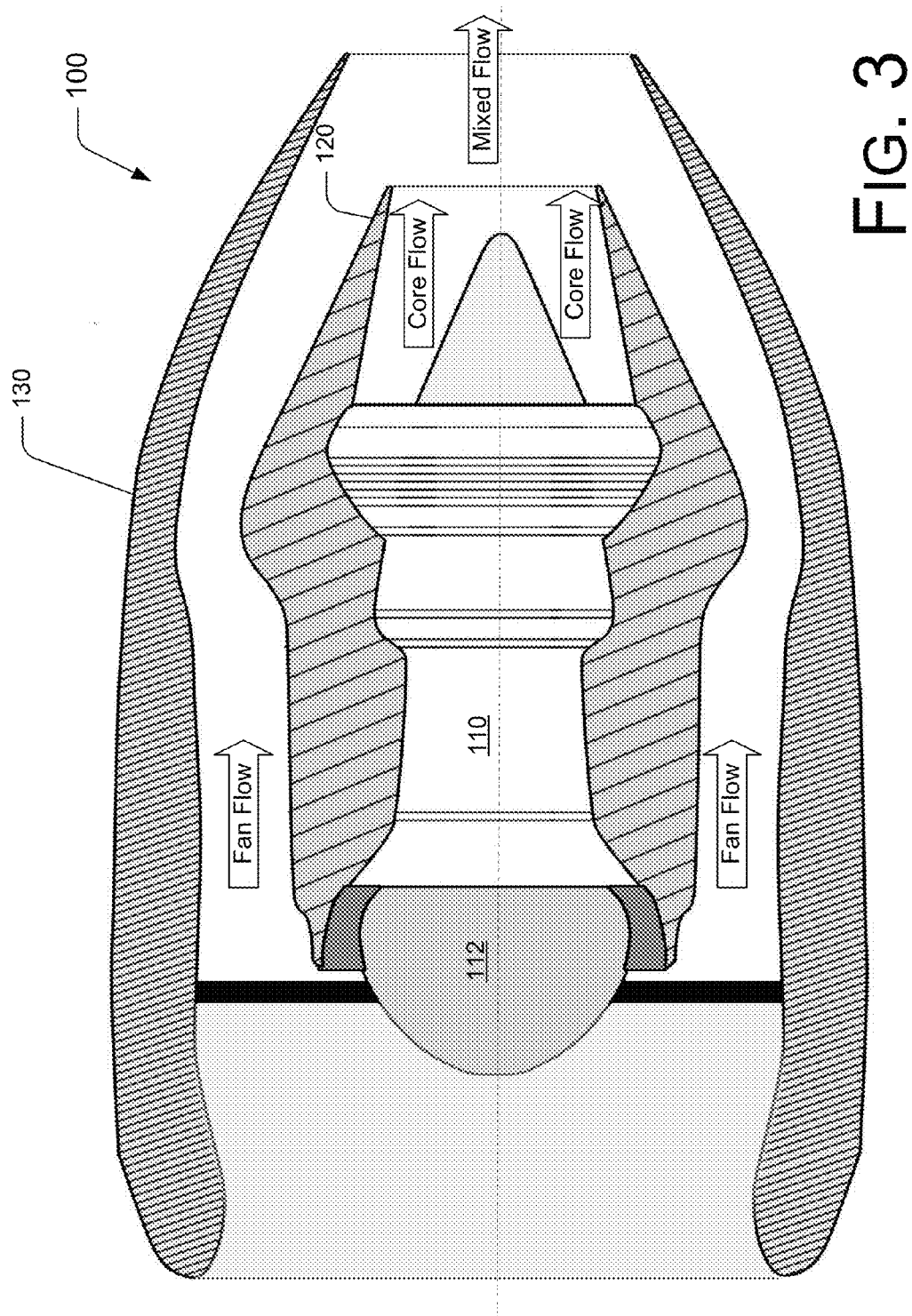

FIGS. 1-3 are schematic cross-sectional illustrations of gas turbine engine configurations into which thermoelectric generators may be installed, according to embodiments. Referring to FIG. 1, a gas turbine engine configuration comprises an engine 110, a fan 112, a core nozzle 120 extending downstream from the engine and a fan nozzle 130 surrounding at least a portion of the core nozzle 120. As described above, in operation the engine 110 creates a core flow of gas which is expelled via the core nozzle 120. The engine 110 also drives a fan 112, the blades 114 of which compress the bypassed flow of air referred to as the fan flow through the fan nozzle 130.

FIGS. 2 and 3 are schematic cross-sectional illustrations of gas turbine engine configurations similar to the configuration depicted in FIG. 1. The primary difference between the embodiments depicted in FIGS. 1-3 concerns the length of the fan nozzle 130 relative to the core nozzle 120. In FIG. 1 the fan nozzle 130 terminates at a point just short of the termination of core nozzle 120. By contrast, in FIG. 2 the fan nozzle 130 terminates at a point well short of the termination of the core nozzle 120, such that the fan flow and the core flow are expelled in separate streams. While in FIG. 3 the fan nozzle 130 terminates behind the termination of the core nozzle 120.

In some embodiments the core nozzle 120 is adapted to define a plenum in which a thermoelectric generator assembly may be mounted. One such embodiment is depicted in FIG. 4. Referring to FIG. 4, in some embodiments the core nozzle 120 comprises a core nozzle wall 122 defining a core through which a core stream flows. The core nozzle further comprises a cowling assembly 124 coupled to the core nozzle wall 120. Together, the core nozzle wall 122 and the cowling assembly 124 define a plenum 140 to receive a portion of the core stream flow from the core nozzle 120.

In some embodiments a first heat transfer fin 142 is positioned in the plenum to transfer heat from a portion of the core stream flow from the core nozzle 120 to the thermoelectric generator assembly 150. Similarly, in some embodiments a second heat transfer fin 144 may be positioned in the plenum to transfer heat from the thermoelectric generator assembly 150 to a portion of the fan stream flow from the fan nozzle 130. In the embodiment depicted in FIG. 4 gas flows to the first heat transfer fin 142 via a surface inlet 146, sometimes called a submerged inlet, which is an inlet design that consists of a shallow ramp with curved walls recessed into an exposed surface of a streamlined body which allows air to flow into the plenum 140. By contrast, air flows to the second heat transfer fin 144 via a scoop inlet 148, which is an inlet with an opening, or a scoop, that is placed into the flow stream with the opening facing the oncoming flow. One skilled in the art will recognize that the respective first and second heat transfer fins 142, 144, could be accessed by either respective surface inlets 146 or scoop inlets 148.

A thermoelectric generator assembly 150 is positioned in the plenum 140. In some embodiments the thermoelectric generator assembly 150 has a first surface 152 positioned adjacent to the core stream flow and a second surface 154 positioned adjacent the fan stream flow. Gas in the plenum 140 is expelled into the fan stream in the fan nozzle 130, such that the propulsive value of the gas is captured.

In practice, the plenum 140 may define a sufficiently large volume such the airflow velocity in the plenum 140 may be different than airflow velocity in the core stream. In operation, the heat from the core flow gas creates a temperature differential across the thermoelectric generator assembly 150, which in turn causes the thermoelectric generator assembly 150 to generate an electrical current.

In some embodiments the thermoelectric generator assembly 150 may be constructed substantially in accordance with one or more of the embodiments described in commonly assigned and copending U.S. Patent Publication No. 2011/0108080 to Kwok, et al., entitled Thermoelectric Generator Assembly and System, and U.S. Patent Publication No. 2009/0159110 to Kwok, et al., entitled Thermoelectric Generation System, the disclosures of which is incorporated herein by reference in its entirety. FIG. 5 is a simplified schematic illustration of a thermoelectric generator assembly 150 suitable for use herein. Referring to FIG. 5, in some embodiments a thermoelectric generator assembly 150 comprises a frame 156, a plurality thermoelectric generator devices 158 mounted on the frame, and a power bus 160 to transport the energy generated by the thermoelectric generator devices.

FIGS. 6-11 are schematic, perspective views of thermoelectric generator assemblies installed on gas turbine engines, according to embodiments. In the embodiments depicted in FIGS. 6-11 the fan nozzle is cut away to show the core nozzle 120, a portion of the thermoelectric generator assembly 150 disposed in the plenum 140. Referring first to FIGS. 6-7, in some embodiments the plenum 140 may extend along a substantial portion of the length of the core nozzle 120. A plurality of frames 156 of thermoelectric generator assembly 150 may be disposed in the plenum 140 to generate electricity as described above. FIGS. 8-9 illustrate a second embodiment in which the frames are arranged in the plenum 140 to define a peaked three-dimensional surface. FIGS. 10-11 illustrate a second embodiment in which the TEG frames are arranged in the plenum 140 to define a corrugated three-dimensional surface.

FIG. 12 is a flowchart illustrating operations in a method to generate electricity in a gas turbine engine, according to embodiments. Referring to FIG. 12, at operation 1210 a core stream flow is generated and at operation 1215 a fan stream flow is generated. In some embodiments, operations 1210 and 1215 may be implemented by a gas turbine engine such as, e.g., a jet engine, when the engine is activated.

At operation 1220 a portion of the core stream flow is redirected from the core nozzle through the plenum, e.g., by using a heat transfer fin 142 as described above. Similarly, at operation 1225 a portion of the fan stream flow is redirected through the plenum, e.g., by using a heat transfer fin 144 as described above.

At operation 1230 the redirected portion of the core stream flow is passed over the first surface of the thermoelectric generator assembly 150, and at operation 1235 the redirected portion of the fan stream flow is passed over the second surface of the thermoelectric generator assembly 150. At operation 1240 the thermoelectric generator assembly 150 produces electricity from the temperature differential between the first surface and the second surface of the thermoelectric generator assembly 150. At operation 1245 the streams are expelled from the plenum into the fan stream.

Figure 13:
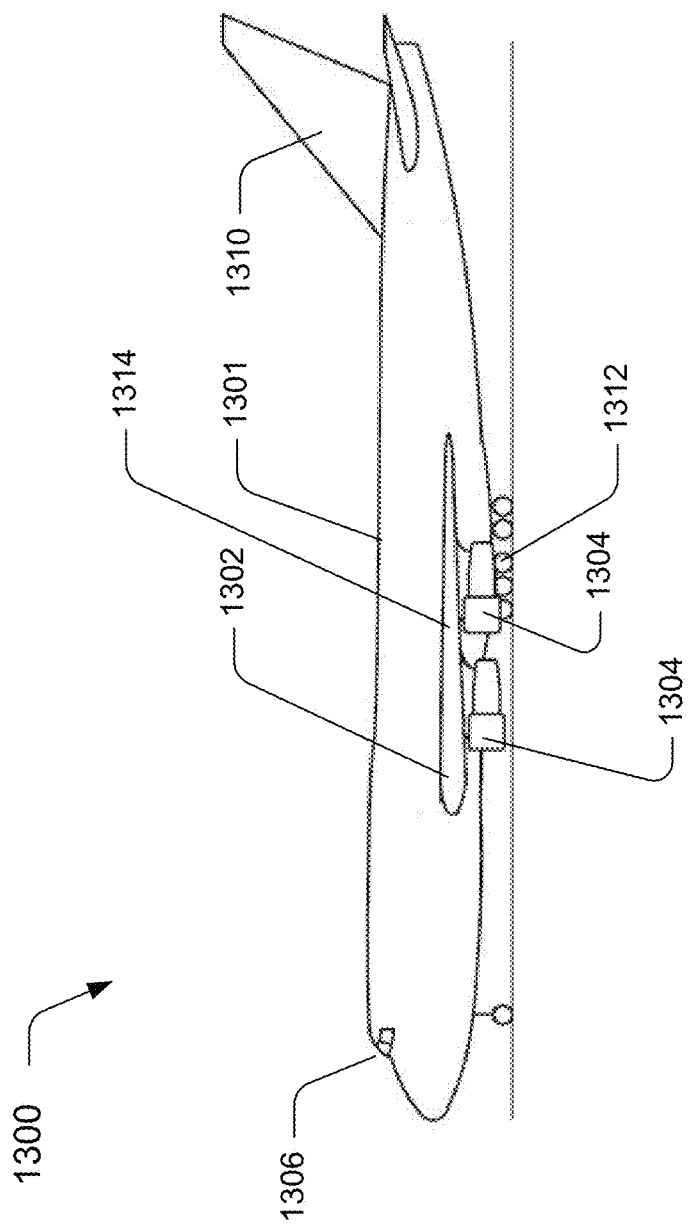
FIG. 13 is a schematic illustration an aircraft which may incorporate one or more gas turbine engine assemblies adapted to include a thermoelectric generator assembly, according to embodiments.

FIG. 13 is a schematic illustration of an aircraft 1300 having a nozzle configured according to embodiments. Referring to FIG. 13, an aircraft 1300 comprises wings 1302, a fuselage 1301, and a propulsion system 1304. The illustrated propulsion system 1304 comprises at least one gas turbine engine, which may be implemented as a turbofan engine carried by the wings 1302. One or more of the propulsion systems 1304 may be embodied as described above to include one or more thermoelectic generator assemblies 150.

Thus, described herein are embodiments of gas turbine engine assemblies which bleed off a small portion of the core gas flow to generate electricity. When energy is removed permanently from either flow stream in an aircraft engine, overall performance for the engine may be reduced. But when heat energy is extracted from the core stream and put back into the fan stream, as in the embodiments described herein, engine performance does not suffer. In fact, overall engine performance may be increased. This is the reason why a turbofan outperforms a turbojet in efficiency. In a turbofan, energy is extracted from the hot gas in the engine core by a turbine. Through a mechanical shaft, the turbine drives a fan to move air in the fan stream. Energy in the fan stream increases by the energy extracted by the turbine from the core stream minus the system mechanical inefficiency. Propulsive efficiency for the fan is higher than that for the core. Therefore overall performance increases.

As described herein, in some embodiments a relative small amount of hot gas in the core stream is bled off at the core nozzle wall. A portion of the heat energy in the hot gas is extracted and diverted through the thermoelectric generator assembly 150. Electric power is generated by the thermoelectric generator assembly 150. Remaining heat energy flow through the thermoelectric generator assembly 150 is cooled by a stream of cold fan air which is also bled similarly at core cowling. The now warmer cooling air is returned back to the fan stream prior to the fan nozzle exit. The amount of energy that is used to generate power is the product of the energy extracted into the TEG and the efficiency of the thermoelectric generator assembly 150, i.e. for a twenty percent efficient thermoelectric generator assembly 150, energy used to power generation is twenty percent of the energy extracted and flow into the thermoelectric generator assembly 150; eighty percent of the unused extracted energy is put into the fan stream by the cooling air and returned back within the control volume of the engine.

The remaining hot gas that was bled for power generation, which is now cooler, is put into the fan stream, again, returned back within the control volume of the engine. Adding mass flow in the fan stream increases thrust output from the fan stream directly. Adding energy into the fan stream increases the internal energy in the stream which also increases thrust from the fan stream. For an inviscid (frictionless) system, it can be shown that thrust gained from mass and energy transfer from the core stream into the fan stream is greater than the thrust lost from the same mass decrement in the core stream. In a real system, thrust balance is the result from performance efficiency of the installation.

Reference in the specification to "one embodiment" or "some embodiments" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A core nozzle for a gas turbine engine, comprising:
   a core nozzle wall defining a core, configured to receive a core stream of the gas turbine engine;
   a cowling assembly coupled to the core nozzle wall, defining a fan flow region configured to receive a fan stream of the gas turbine engine;
   a thermoelectric generator assembly positioned in a plenum;
   a first inlet of the plenum configured to transfer a portion of the core stream to the thermoelectric generator assembly;
   a second inlet of the plenum configured to transfer a portion of the fan stream to the thermoelectric generator assembly; and
   an outlet of the plenum configured to combine and discharge the portion of the fan stream and the portion of the core stream into the fan stream.

2. The core nozzle of claim 1, further comprising:
   a first heat transfer fin positioned in the plenum to transfer heat from a portion of the core stream to the thermoelectric generator assembly.

3. The core nozzle of claim 2, further comprising:
   a second heat transfer fin positioned in the plenum to transfer heat from the thermoelectric generator assembly to the fan stream.

4. The core nozzle of claim 3, wherein:
   the first heat transfer fin comprises the first inlet; and
   the second heat transfer fin comprises the second inlet.

5. The core nozzle of claim 4, wherein:
   the thermoelectric generator assembly has a first surface positioned adjacent to the core stream and a second surface positioned adjacent the fan stream.

6. The core nozzle of claim 1, wherein the thermoelectric generator assembly comprises at least one of peaked three-dimensional surfaces or corrugated three-dimensional surfaces.

7. The core nozzle of claim 1, wherein the thermoelectric generator assembly comprises:
   a frame;
   a plurality thermoelectric generator devices mounted on the frame; and
   a power bus to transport energy generated by the thermoelectric generator devices.

8. A gas turbine engine assembly, comprising:
   an engine assembly;
   a core nozzle positioned adjacent the engine assembly to direct a core stream generated by the engine assembly;
   a fan nozzle surrounding at least a portion of the core nozzle to direct a fan stream;
   a thermoelectric generator assembly positioned in a plenum;
   a first inlet of the plenum configured to transfer a portion of the core stream to the thermoelectric generator assembly;
   a second inlet of the plenum configured to transfer a portion of the fan stream to the thermoelectric generator assembly; and
   an outlet of the plenum configured to combine and discharge the portion of the fan stream and the portion of the core stream into the fan stream.

9. The gas turbine engine assembly of claim 8, further comprising:
   a first heat transfer fin positioned in the plenum to transfer heat from a portion of the core stream to the thermoelectric generator assembly.

10. The gas turbine engine assembly of claim 9, further comprising:
    a second heat transfer fin positioned in the plenum to transfer heat from the thermoelectric generator assembly to a portion of the fan stream from the fan nozzle.

11. The gas turbine engine assembly of claim 10, wherein:
    the first heat transfer fin comprises the first inlet; and
    the second heat transfer fin comprises the second inlet.

12. The gas turbine engine assembly of claim 11, wherein:
    the thermoelectric generator assembly has a first surface positioned adjacent to the core stream and a second surface positioned adjacent the fan stream.

13. The gas turbine engine assembly of claim 8, wherein the thermoelectric generator assembly comprises at least one of peaked three-dimensional surfaces or corrugated three-dimensional surfaces.

14. The gas turbine engine assembly of claim 8, wherein the thermoelectric generator assembly comprises:
    a frame;
    a plurality thermoelectric generator devices mounted on the frame; and
    a power bus to transport energy generated by the thermoelectric generator devices.

15. A method to generate electricity in a gas turbine engine, comprising:
    generating a core stream in the gas turbine engine;
    generating a fan stream in the gas turbine engine;
    transferring, via a first inlet of a plenum, a portion of the core stream from a core nozzle positioned downstream of the gas turbine engine;
    passing the portion of the core stream over a first surface of a thermoelectric generator assembly;
    transferring, via a second inlet of the plenum, a portion of the fan stream into the plenum;
    passing the portion of the fan stream over a second surface of the thermoelectric generator assembly; and
    combining and discharging, via an outlet of the plenum, the portion of the fan stream and the portion of the core stream into the fan stream.

16. The method of claim 15, wherein the plenum is partially defined by a core nozzle wall and a cowling assembly of the core nozzle, and wherein one or more heat transfer fins transfer heat in the plenum.

17. The method of claim 16, wherein airflow velocity in the plenum is different than airflow velocity in the core stream.

18. The method of claim 15, further comprising generating electricity based on a temperature differential between the first surface of the thermoelectric generator assembly and the second surface of the thermoelectric generator assembly.

19. The method of claim 15, further comprising transporting electricity from the thermoelectric generator assembly on a power bus.

* * * * *